(12) United States Patent
Annunziata et al.

(10) Patent No.: US 10,168,143 B2
(45) Date of Patent: Jan. 1, 2019

(54) STRAIN MONITORING OF MRAM ARRAYS

(71) Applicant: INTERNATIONAL BUSINESS MACHINES CORPORATION, Armonk, NY (US)

(72) Inventors: Anthony J. Annunziata, Stamford, CT (US); Chandrasekharan Kothandaraman, New York, NY (US); Thomas M. Shaw, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/453,431

(22) Filed: Mar. 8, 2017

(65) Prior Publication Data

US 2018/0259322 A1 Sep. 13, 2018

(51) Int. Cl.
| | | |
|---|---|---|
| *G01B 9/02* | (2006.01) | |
| *G01B 11/16* | (2006.01) | |
| *H01L 27/22* | (2006.01) | |
| *H01L 43/08* | (2006.01) | |
| *H01L 23/528* | (2006.01) | |
| *G11C 29/00* | (2006.01) | |
| *G11C 11/16* | (2006.01) | |

(52) U.S. Cl.
CPC .......... *G01B 11/161* (2013.01); *G11C 11/161* (2013.01); *G11C 29/00* (2013.01); *H01L 23/528* (2013.01); *H01L 27/222* (2013.01); *H01L 43/08* (2013.01)

(58) Field of Classification Search
CPC .... G01N 21/47; G01N 21/4788; G01N 21/95; G01B 11/16; G01B 11/161; G11C 11/161; G11C 29/00; H01L 23/528; H01L 27/222; H01L 43/08
USPC .................. 356/35.5, 521, 237.4, 237.5, 947
See application file for complete search history.

(56) References Cited

U.S. PATENT DOCUMENTS

| | | |
|---|---|---|
| 5,798,521 A | 8/1998 | Froggatt |
| 7,116,752 B2 | 10/2006 | Kumakhov et al. |
| 7,339,676 B2 | 3/2008 | Maris |
| 7,521,265 B2 | 4/2009 | Yokokawa |
| 7,602,000 B2 | 10/2009 | Sun et al. |
| 7,755,752 B1 | 7/2010 | Salnik et al. |
| 9,234,991 B2 | 1/2016 | Foland et al. |
| 9,310,290 B2 | 4/2016 | Wang et al. |

(Continued)

OTHER PUBLICATIONS

Kurita et al, Strain measurement by a diffraction grating method, NDT&E International, vol. 31, No. 2, pp. 77-83, 1998.*

(Continued)

*Primary Examiner* — Tarifur R Chowdhury
*Assistant Examiner* — Jonathon Cook
(74) *Attorney, Agent, or Firm* — Tutunjian & Bitetto, P.C.; Vazken Alexanian

(57) ABSTRACT

A method is presented for determining strain in a magnetoresistive random access memory (MRAM) structure. The method includes exposing long lines of the MRAM structure to monochromatic light to produce a diffraction pattern, measuring changes in interference fringe spacing in the diffraction pattern, determining the changes in the local strain in the MRAM structure from the measured changes in the interference fringe spacing, and assessing a performance of the MRAM structure from values of the changes in the local strain.

6 Claims, 4 Drawing Sheets

(56) References Cited

U.S. PATENT DOCUMENTS

2002/0008988 A1* 1/2002 Lenssen .............. G11C 11/14
428/693.1
2015/0371910 A1 12/2015 Goodwin et al.
2016/0139065 A1 5/2016 Barak et al.

OTHER PUBLICATIONS

Uchida et al, Differential Stress in MgO Measured in the Deformation-DIA by Using High-resolution Monochromatic Diffraction, Consortium for Advanced Radiation Sources (CARS), The University of Chicago, Chicago, IL, U.S.A., 2004.*

Loong et al., "Strain-enhanced tunneling magnetoresistance in MgO magnetic tunnel junctions", Scientific Reports. Sep. 30, 2014, pp. 1-7.

* cited by examiner

STRAIN MONITORING OF MRAM ARRAYS

BACKGROUND

Technical Field

The present invention relates generally to semiconductor devices, and more specifically, to strain monitoring of MRAM (magnetoresistive random access memory) arrays.

Description of the Related Art

MRAM is a non-volatile random access memory technology that could replace the dynamic random access memory (DRAM) as the standard memory for computing devices. The use of MRAM as a non-volatile RAM would allow for "instant on" systems that come to life as soon as the system is turned on, thus saving the amount of time needed for a conventional PC, for example, to transfer boot data from a hard disk drive to volatile DRAM during system power up.

SUMMARY

In accordance with an embodiment, a method is provided for determining local strain in a magnetoresistive random access memory (MRAM) structure. The method includes exposing long lines of the MRAM structure to monochromatic light to produce a diffraction pattern, measuring changes in interference fringe spacing in the diffraction pattern, determining changes in the local strain in the MRAM structure from the measured changes in the interference fringe spacing, and assessing a performance of the MRAM structure from values of the changes in the local strain.

In accordance with another embodiment, a method is provided for determining local strain in a magnetoresistive random access memory (MRAM) structure. The method includes directing a monochromatic light on the MRAM structure to produce a diffraction pattern, measuring changes in interference fringe spacing in the diffraction pattern, and collecting diffraction information related to the interference fringe spacing from bit line geometry of the MRAM structure to assess performance of the MRAM structure.

In accordance with another embodiment, a system for determining local strain in a magnetoresistive random access memory (MRAM) structure is provided. The system includes an array of magnetic tunnel junction (MTJ) devices with a plurality of bit lines, and a monochromatic light source directed on a portion of the plurality of bit lines to produce a diffraction pattern. The diffraction pattern is used to measure changes in interference fringe spacing correlating to changes in local strain.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
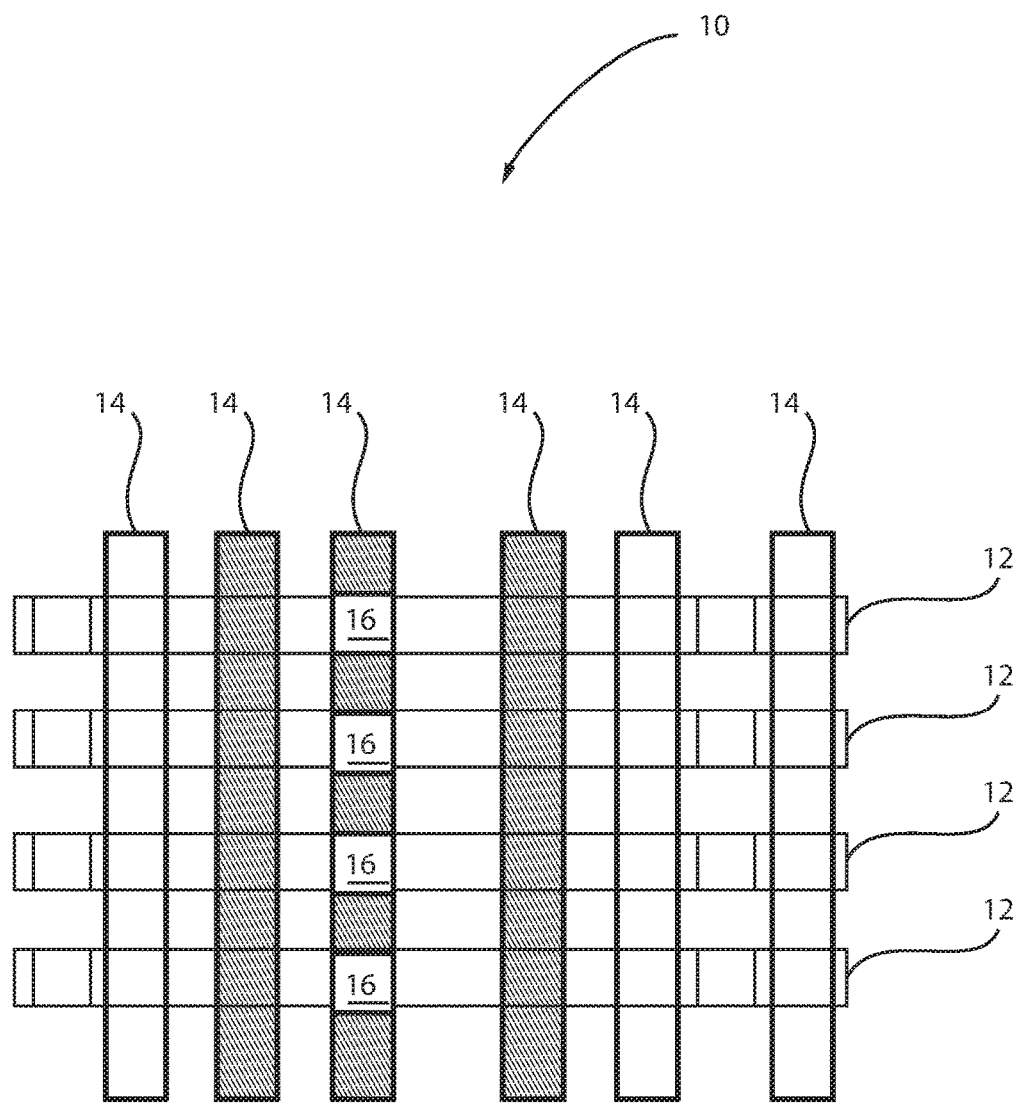
FIG. 1 is a magnetoresistive random access memory (MRAM) structure including a plurality of bit lines and word lines, in accordance with an embodiment of the present invention.

In one or more embodiments, a method is provided for determining local strain in a magnetoresistive random access memory (MRAM) structure. The method includes exposing long lines of the MRAM structure to monochromatic light to produce a diffraction pattern, measuring changes in interference fringe spacing in the diffraction pattern, determining changes in the local strain in the MRAM structure from the measured changes in the interference fringe spacing, and assessing a performance of the MRAM structure from values of the changes in the local strain.

In one or more embodiments, a method is provided for determining local strain in a magnetoresistive random access memory (MRAM) structure. The method includes directing a monochromatic light on the MRAM structure to produce a diffraction pattern, measuring changes in interference fringe spacing in the diffraction pattern, and collecting diffraction information related to the interference fringe spacing from bit line geometry of the MRAM structure to assess performance of the MRAM structure.

In one or more embodiments, a system for determining local strain in a magnetoresistive random access memory (MRAM) structure is provided. The system includes an array of magnetic tunnel junction (MTJ) devices with a plurality of bit lines, and a monochromatic light source directed on a portion of the plurality of bit lines to produce a diffraction pattern. The diffraction pattern is used to measure changes in interference fringe spacing correlating to changes in local strain.

In one or more embodiments, the bit lines that connect the MRAM cells are organized into long wires of uniform spacing. This is a natural way to layout the MRAM array so that no additional design effort is necessary. A laser is pointed on the MRAM array of wires and the diffraction of the laser beam is monitored (i.e., measure the fringes formed in the far-field). Even small changes in the local strain show up in the measured fringe pattern.

In one or more embodiments, a pattern of bit lines are used as a diffraction grid in measuring strain in MRAM structures including MTJ arrays.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

The term "direct contact" or "directly on" means that a first element, such as a first structure, and a second element, such as a second structure, are connected without any intermediary conducting, insulating or semiconductor layers at the interface of the two elements.

The terms "overlying", "atop", "positioned on" or "positioned atop" means that a first element, such as a first structure, is present on a second element, such as a second structure, wherein intervening elements, such as an interface structure can be present between the first element and the second element.

The term "electrically connected" means either directly electrically connected, or indirectly electrically connected, such that intervening elements are present; in an indirect electrical connection, the intervening elements can include inductors and/or transformers.

As used herein, "p-type" refers to the addition of impurities to an intrinsic semiconductor that creates deficiencies of valence electrons. In a silicon-containing substrate, examples of n-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

The term "processing" as used herein includes deposition of material or photoresist, patterning, exposure, development, etching, cleaning, stripping, implanting, doping, stressing, layering, and/or removal of the material or photoresist as required in forming a described structure.

As used herein, "depositing" can include any now known or later developed techniques appropriate for the material to be deposited including but not limited to, for example: chemical vapor deposition (CVD), low-pressure CVD (LP-CVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The word "exemplary" is used herein to mean "serving as an example, instance, or illustration," Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this invention.

The present subject matter will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Unlike conventional random access memory (RAM) chip technologies, in magnetic RAM (MRAM) data is not stored as electric charge but is instead stored by magnetic polarization of storage elements. The storage elements are formed from two ferromagnetic layers separated by a tunneling barrier layer. One of the two layers, called the fixed layer, has at least one reference magnetic polarization set to a particular polarity. The magnetic polarity of the other magnetic layer, called the free layer, is altered to represent either a "1" (e.g., anti-parallel to the fixed reference layer) or "0" (e.g., parallel to the fixed reference layer). One such device having a fixed layer, a tunneling barrier layer, and a free layer is a magnetic tunnel junction (MTJ). The electrical resistance of an MTJ is dependent on the magnetic polarity of the free layer compared to the magnetic polarity of the fixed layer. A memory device such as MRAM is built from an array of individually addressable MTJs.

To write data in a conventional MRAM, a write current is applied through an MTJ. The write current has a magnitude exceeding a level called the critical switching current level which is sufficient to change the orientation of spin or magnetization in the free layer. When the write current flows in a first direction, the MTJ can be placed into or remain in a first state, where its magnetizations are in a parallel orientation. When the write current flows in a second direction, opposite to the first direction, the MTJ can be placed into or remain in a second state, where its magnetizations are in an anti-parallel orientation.

To read data in a conventional MRAM, a read current can flow through the MTJ via the same current path used to write data in the MTJ. If the magnetizations of the MTJ are in a parallel orientation, the MTJ presents a resistance that is different than the resistance the MTJ would present if the magnetizations of the MTJ element were in an anti-parallel orientation. Thus, in a conventional MRAM, there are two distinct states defined by two different resistances, and logic "0" or a logic "1" value can be read based on the state.

Bit cells of a magnetic random access memory can be arranged in one or more arrays including a pattern of memory elements (e.g., MTJs in case of MRAM). STT-MRAM (Spin-Transfer-Torque Magnetic Random Access Memory) is an emerging nonvolatile memory that has advantages of non-volatility, comparable speed to eDRAM (Embedded Dynamic Random Access Memory), smaller chip size compared to eSRAM (Embedded Static Random Access Memory), unlimited read/write endurance, and low array leakage current.

In one category of MRAM memory cells, the direction of polarization of the free layer and the reference layer of a magnetic tunnel junction (MTJ) is parallel to the plane of the respective layer. Such memory cells are referred to as having in-plane magnetic anisotropy or longitudinal magnetic anisotropy (LMA). In another category of MRAM memory cells, the direction of polarization of the free layer and reference layer of an MTJ is perpendicular to the plane of the respective layer. Such memory cells are referred to as having perpendicular magnetic anisotropy (PMA).

FIG. 1 is a magnetoresistive random access memory (MRAM) structure including a plurality of bit lines and word lines, in accordance with an embodiment of the present invention.

In various embodiments, a memory structure or memory matrix 10 includes a plurality of word lines 12 and a plurality of bit lines 14. The word lines 12 are parallel to each other and are illustrated horizontally. The bit lines 14 are parallel to each other and are illustrated vertically. The intersection of the word lines 12 and the bit lines 14 results in memory cells 16.

Memory is made up of bits arranged in a two-dimensional grid. Memory cells are etched onto a silicon wafer in an array of columns (bitlines) 14 and rows (wordlines) 12. The intersection of a bitline 14 and wordline 12 constitutes the address of the memory cell 16.

DRAM works by sending a charge through the appropriate column (CAS) to activate the transistor at each bit in the column. When writing, the row lines contain the state the capacitor should take on. When reading, the sense-amplifier determines the level of charge in the capacitor. If it is more than 50 percent, it reads it as a 1; otherwise it reads it as a 0. The counter tracks the refresh sequence based on which rows have been accessed in what order. The length of time necessary to do all this is so short that it is expressed in nanoseconds (billionths of a second). A memory chip rating of 70 ns means that it takes 70 nanoseconds to completely read and recharge each cell.

Memory cells alone would not be useful without some way to get information in and out of them. So the memory cells have a whole support infrastructure of other specialized circuits. These circuits perform functions such as identifying each row and column (row address select and column address select), keeping track of the refresh sequence (counter), reading and restoring the signal from a cell (sense amplifier), and telling a cell whether it should take a charge or not (write enable).

In SDRAM terminology the rows are called word-line, whereas the columns are named bit-lines. Physically the word-lines are represented by the so called "gate-contact lines" (GC-lines), which are "metallic" or "poly-Si" (or combination of both) stripes. They are connecting the gates of all transistors of a certain row in the array-segment. Thus, when activating/deactivating a word-line, i.e., increasing/decreasing the voltage on/from it, all transistors which are on this row of the array-segment open or correspondingly close.

The voltage of each word-line is raised (transistor ON) and lowered (transistor OFF) by the so called word-line drivers (WLD). The higher the number of transistors connected to one word-line driver, i.e., the bigger the array-segment is, the higher the capacitance of the word-line and consequently more powerful should be the word-line driver in order to control the word-line. If the word-line driver is not powerful enough it can happen that the transistors at the end of the word-line (faraway from the word-line driver itself) does not become the necessary potential in order to be opened properly. The word-line drivers cannot be made powerful enough to drive a very long word-line due to space limitations on the chip. A more powerful word-line driver needs more real estate on the chip and, thus, decreases the array efficiency of the chip. Designers usually find a compromise between the length of the word-line and the size of the word-line driver.

Bit-lines 14 are "metallic" stripes perpendicular to the wordlines 12, and are physically connected to the source/drains of the cell-transistors. In other words, the bit-lines are the lines through which information is written/read to/from the memory cells. Information is read from the cell, or written into the cell by the so called sense-amplifiers. Each bit-line is connected to a sense-amplifier. As with wordline-drivers, the sense-amplifiers cannot be made too big, i.e., to be high performant, due to real estate limitations on the chip. However, they should be good enough in order to read and write the information into the cells 16 correctly.

Magnetic Tunneling Junction (MTJ) devices include two ferromagnetic films, or plates, separated by a thin insulating layer to form magnetic storage elements. It will be recognized that the magnetic material can be any suitable material, combination of materials, or alloy that exhibits magnetic properties, such as a ferromagnetic material or a ferromagnetic thin film including CoFe, CoFeB, NiFe, etc. By sharing MRAM manufacturing processes with magnetic film integration techniques, the embodiments described herein are able to more efficiently provide integrated magnetic field enhanced circuit elements.

The MTJ stacks are comprised of two layers of ferromagnetic material separated by a thin insulating tunnel barrier layer. The insulating layer is sufficiently thin that quantum-mechanical tunneling of the charge carriers occurs between the ferromagnetic electrodes. The tunneling process is electron spin dependent, which means that the tunneling current across the junction depends on the spin-dependent electronic properties of the ferromagnetic materials and is a function of the relative orientation of the magnetic moments (magnetization directions) of the two ferromagnetic layers. The two ferromagnetic layers are designed to have different responses to magnetic fields so that the relative orientation of their moments can be varied with an external magnetic field. The MTJ is usable as, e.g., a memory cell in a nonvolatile magnetic random access memory (MRAM)

array, and as, e.g., a magnetic field sensor, such as a magnetoresistive read head in a magnetic recording disk drive.

MRAM is a type of solid state memory that uses tunneling magnetoresistance (TMR) to store information. MRAM is made up of an electrically connected array of magnetoresistive memory elements, referred to as MTJs. Each MTJ includes a free layer having a magnetization direction that is variable, and a fixed layer having a magnetization direction that is invariable. The free layer and fixed layer each include a layer of a magnetic material, and are separated by an insulating non-magnetic tunnel barrier. Each MTJ stores information by switching the magnetization state of the free layer. When the magnetization direction of the free layer is parallel to the magnetization direction of the fixed layer, the MTJ is in a low resistance state. When the magnetization direction of the free layer is anti-parallel to the magnetization direction of the fixed layer, the MTJ is in a high resistance state. The difference in resistance of the MTJ can be used to indicate a logical '1' or '0', thereby storing a bit of information. The TMR of the MTJ determines the difference in resistance between the high and low resistance states. A relatively high difference between the high and low resistance states facilitates read operations in the MRAM.

In an exemplary embodiment, the intermediate layer of the MTJ is a tunnel barrier layer which can comprise one or more layers of aluminum oxide ($Al_2O_3$), silicon dioxide ($SiO_2$), tantalum oxide ($Ta_2O_5$), silicon nitride ($SiN_4$), aluminum nitride (AlN), or magnesium oxide (MgO), singly or in combination. Other dielectrics and/or semiconductor materials can also be used for the intermediate layer. The thickness of the intermediate layer is determined so as to inhibit exchange coupling between the data and reference layers in accordance with the particular electromagnetic conditions and configuration of the cell in question. For example, in certain exemplary embodiments, the intermediate layer might be about 0.5 nanometers to three nanometers thick.

Typically, the data layer or free layer is magnetically harder than the reference layer. For example, in certain implementations, the coercivity of the data layer can be about 2-5 times greater than the coercivity of the reference layer, although the actual ratio is a matter of design choice. The coercivities of the two layers can be different as a result of different physical configurations (e.g., shapes, sizes, geometries, thicknesses, etc.) and/or compositions. In an exemplary embodiment, ferromagnetic materials suitable for the data layer and the reference layer include nickel iron (NiFe), nickel iron cobalt (NiFeCo), cobalt iron (CoFe), other magnetically soft alloys of NiFe and Co, doped amorphous ferromagnetic alloys, PERMALLOY™, and other materials. The data layer and the reference layer are not necessarily (and in fact often are not) made of the same material.

Figure 2:
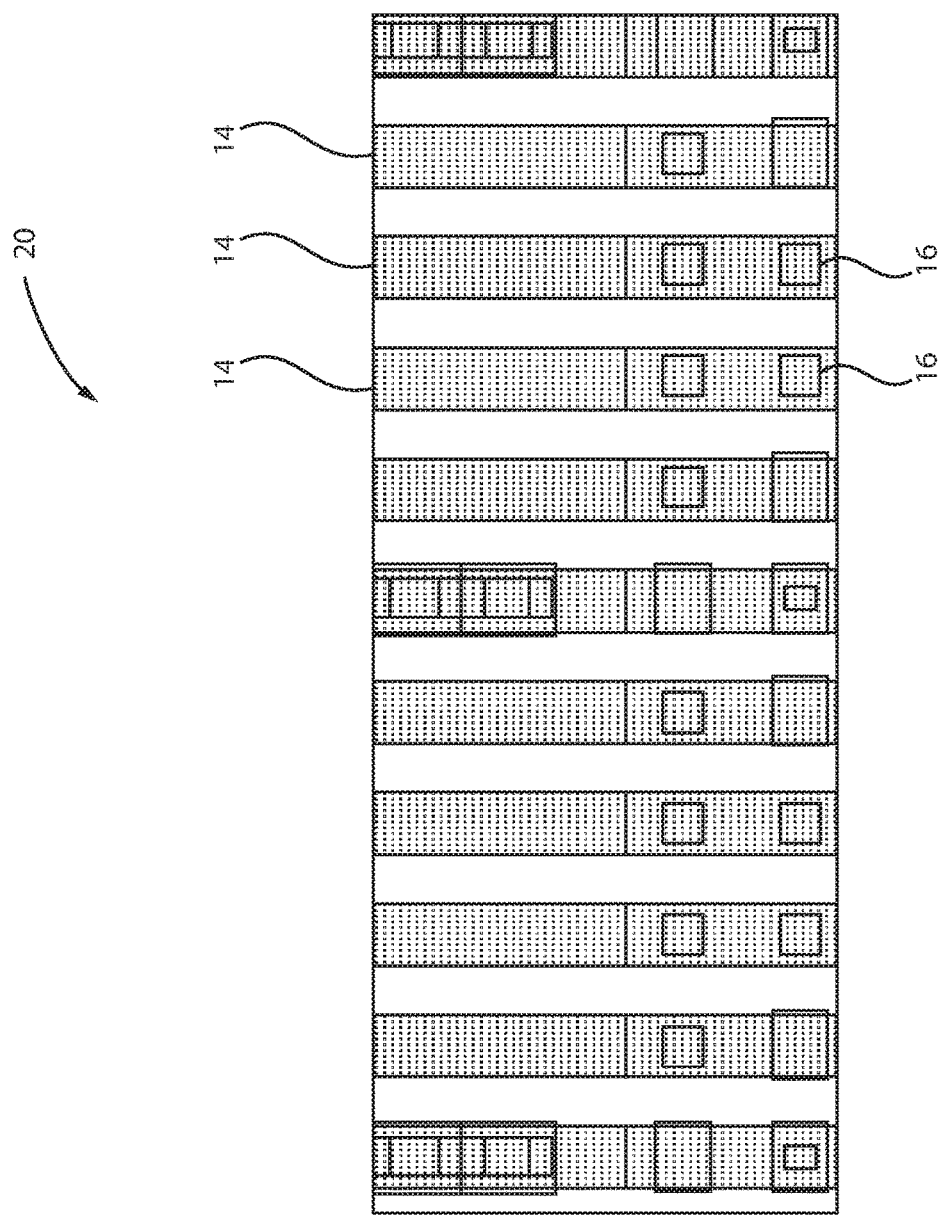
FIG. 2 is a layout view of the MRAM structure of FIG. 1, in accordance with an embodiment of the present invention.

FIG. 2 is a layout view of the MRAM structure of FIG. 1, in accordance with an embodiment of the present invention.

In various embodiments, the layout view 20 depicts the bit lines 14, as well as the cells 16 formed at the intersection of the bit lines 14 and the word lines 12.

Figure 3:
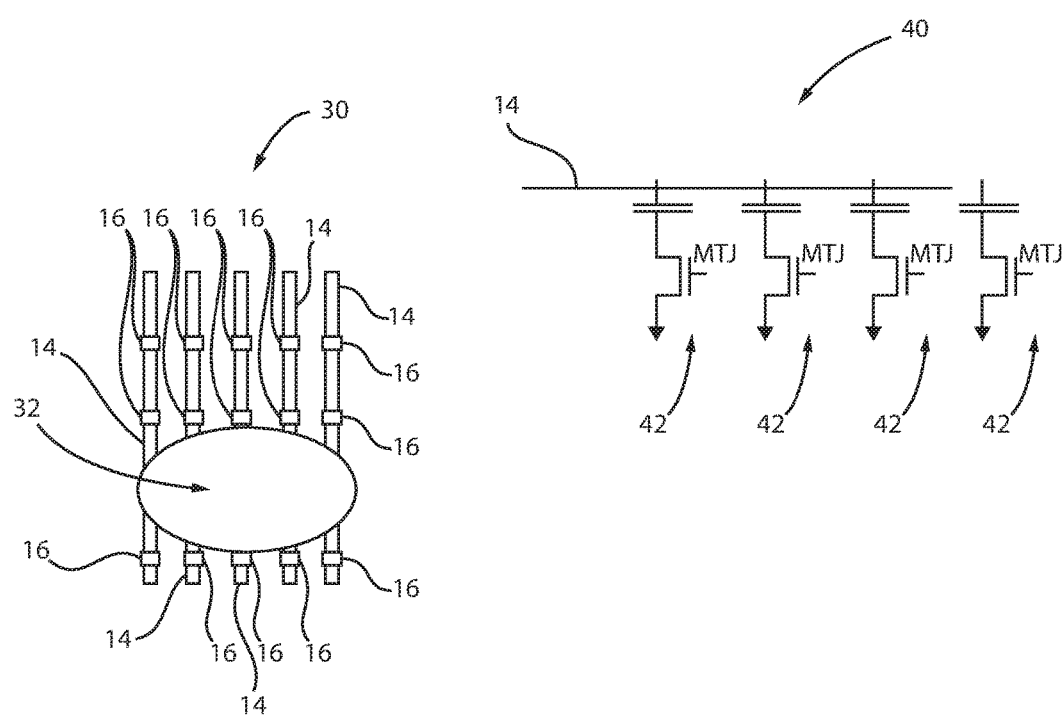
FIG. 3 is a block/flow diagram of an exemplary system for determining strain in the MRAM structure of FIGS. 1 and 2, in accordance with an embodiment of the present invention.

FIG. 3 is a block/flow diagram of an exemplary system for determining strain in the MRAM structure of FIGS. 1 and 2, in accordance with an embodiment of the present invention.

In various embodiments, a system 30 is presented where a laser 32 directs light onto a section of the bitlines 14. The system 30 can include a circuit 40 having a plurality of MTJs 42. The plurality of MTJs 42 can be connected to a bit line 14. Therefore, the system 30 exposes long lines, such as bit lines 14, of the MRAM structure to a monochromatic light triggered by, e.g., a laser 32. Instead of a laser, the light projected onto the bit lines 14 can be a white light. The system 30 uses a resulting diffraction pattern to measure changes in interference fringe spacing correlating to changes in local strain.

Interference fringe is a bright or dark band caused by beams of light that are in phase or out of phase with one another. Stated differently, an interference fringe or pattern results from constructive and destructive interference of light waves. By passing sunlight through two narrow slits, the fringe pattern is viewed on a screen placed behind the slits.

Constructive interference occurs when one wave's peak matches the peak from another, creating a situation in which the waves will add to each other. In destructive interference, a peak from one wave pairs with another wave's trough. These waves will neutralize each other. Constructive interference results in a bright line on the screen, while destructive interference results in a dark line.

Light waves and similar wave propagation, when superimposed, will add their crests if they meet in the same phase (the waves are both increasing or both decreasing); or the troughs will cancel the crests if they are out of phase. These phenomena are called constructive and destructive interference, respectively. If a beam of monochromatic light (all waves having the same wavelength) is passed through two narrow slits, the two resulting light beams can be directed to a flat screen on which, instead of forming two patches of overlapping light, they form interference fringes, a pattern of evenly spaced alternating bright and dark bands. All optical interferometers function by virtue of the interference fringes that they produce.

Generally speaking, desirable characteristics for any configuration of memory device include increased speed, reduced power consumption, and/or lower cost. Lower cost can be achieved by a simpler fabrication process and/or a smaller chip surface area. As the size of memory cells is reduced, however, fringe (and/or stray) magnetic fields emanating from a target memory cell during a read or write operation can cause increased magnetic interference among neighboring memory cells. Depending on the proximity of magnetic memory cells to each other and the magnitude of currents being used for read and write operations, fringe magnetic fields can even corrupt a data bit stored in the data layer of a neighboring magnetic memory cell that was not targeted for the read or write operations.

The exemplary embodiments of the present invention provide for a light source that projects light onto long lines, such as bitlines or wordlines. The diffraction of the beam is determined/monitored to measure interference fringes formed in the far field. The resulting fringe pattern reveals strain monitoring of the MRAM arrays having a plurality of MTJs. Thus, using long lines, such as bit lines, in an array, such as an MRAM, is used to monitor/determine strain. A pattern of long lines, such as bit lines, is used as a diffraction grid in measuring the strain (diffraction grating to monitor/determine local strain). The diffraction pattern measures changes in the interference fringe spacing that correlates to changes in local strain. Therefore, the strain state of the MRAM array can be monitored or kept track of. This local strain influences the characteristics of the MRAM array and the monitoring and optimization of the strain is expected to improve the power and performance of the MRAM array.

A diffraction grating is an optical component with a periodic structure, which splits and diffracts light into several beams travelling in different directions. The emerging coloration is a form of structural coloration. The directions of these beams depend on the spacing of the grating and the wavelength of the light so that the grating acts as the dispersive element. For practical applications, gratings generally have ridges or rulings on their surface rather than dark lines. Such gratings can be either transmissive or reflective. Gratings which modulate the phase rather than the amplitude of the incident light are also produced, frequently using holography.

Figure 4:
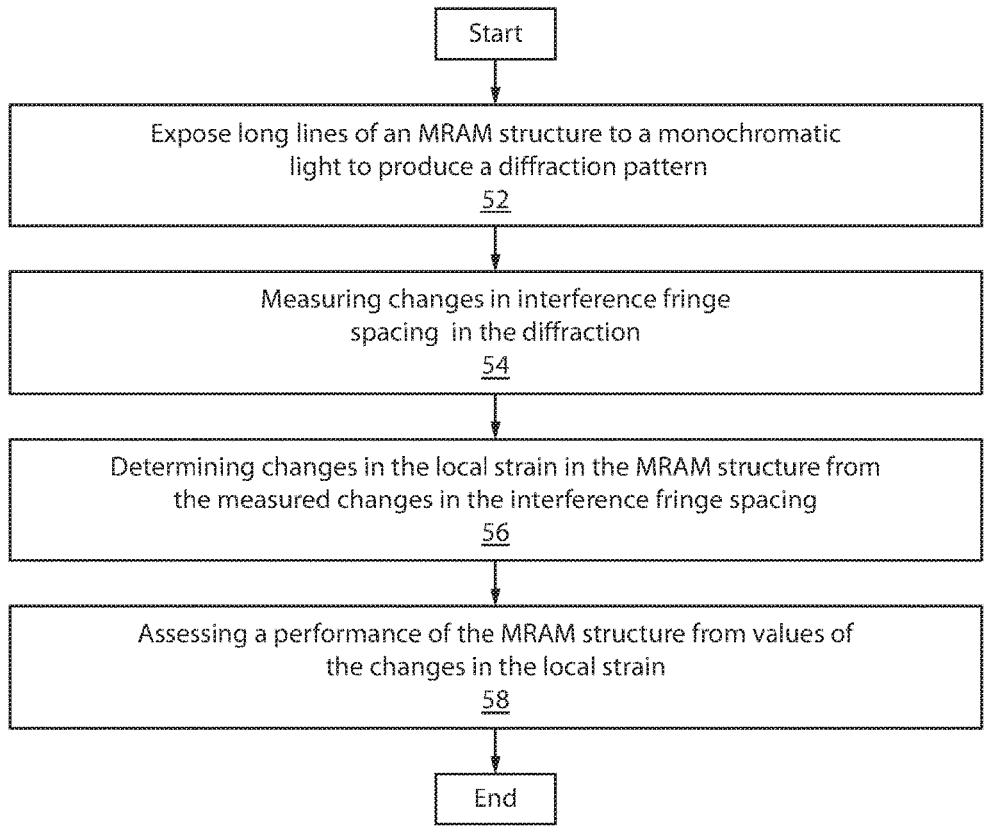
FIG. 4 is a block/flow diagram of an exemplary method for determining strain in the MRAM structure of FIGS. 1 and 2, in accordance with an embodiment of the present invention.

FIG. 4 is a block/flow diagram of an exemplary method for determining strain in the MRAM structure of FIGS. 1 and 2, in accordance with an embodiment of the present invention.

At block 52, long lines of the MRAM structure are exposed to monochromatic light to produce a diffraction pattern.

At block 54, changes in interference fringe spacing in the diffraction are measured.

At block 56, changes in the local strain in the MRAM structure are determined from the measured changes in the interference fringe spacing.

At block 58, a performance of the MRAM structure is assessed from values of the changes in the local strain.

Figure 5:
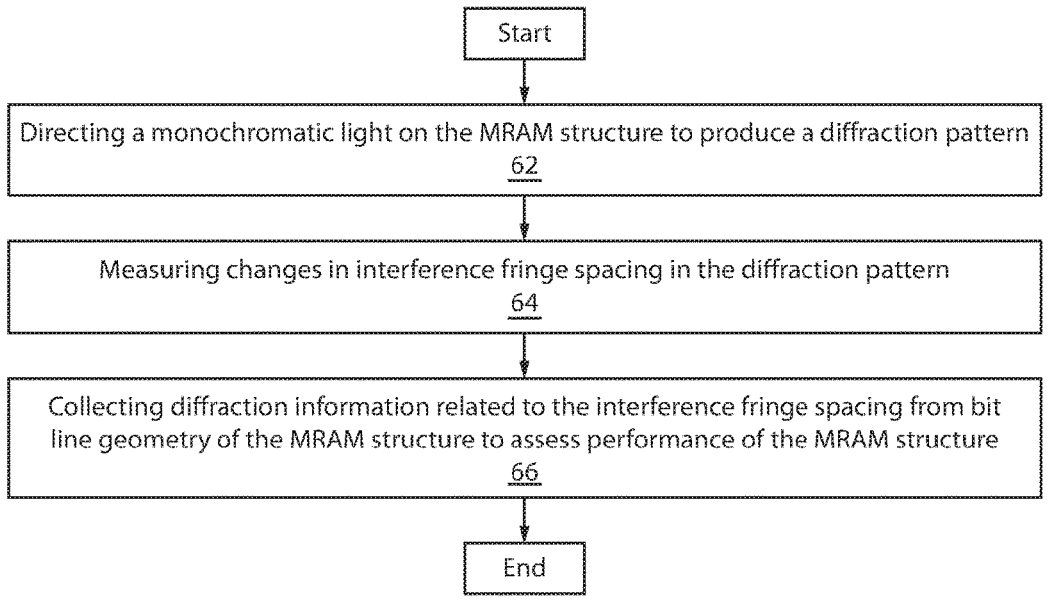
FIG. 5 is a block/flow diagram of an exemplary method for determining strain via a monochromatic light in the MRAM structure of FIGS. 1 and 2, in accordance with an embodiment of the present invention.

FIG. 5 is a block/flow diagram of an exemplary method for determining strain via a monochromatic light in the MRAM structure of FIGS. 1 and 2, in accordance with an embodiment of the present invention.

At block 62, a monochromatic light is directed on the MRAM structure to produce a diffraction pattern.

At block 64, changes in interference fringe spacing in the diffraction pattern are measured.

At block 66, diffraction information related to the interference fringe spacing is collected from bit line geometry of the MRAM structure to assess performance of the MRAM structure.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions can be epitaxial processes, and the deposited material can be crystalline. In various embodiments, formation of a layer can be by one or more deposition processes, where, for example, a conformal layer can be formed by a first process (e.g., ALD, PE-ALD, etc.) and a fill can be formed by a second process (e.g., CVD, electrodeposition, PVD, etc.).

As mentioned earlier, one design goal in the microelectronics field generally is to reduce the size of microelectronic devices. The size of a MRAM device can be reduced by placing the magnetic memory cells closer to each other. However, as the spacing between magnetic memory cells become smaller, the likelihood of magnetic interference caused by fringe magnetic fields among the memory cells increase. Depending on the proximity of the memory cells to each other and the magnitude of applied currents to a target memory cell, fringe magnetic fields emanating from that target memory cell can even corrupt a data bit stored in neighboring memory cells.

The laser is directed toward the array of bit lines and/or word lines, and the diffraction of the laser beam is monitored to measure the fringes formed in the far field. Even small changes in the local strain show up in the fringe pattern.

Thus, effective strain monitoring of MRAM arrays is achieved by using a monochromatic light source, such as a laser, to collect diffraction information from the bitline geometry. Consequently, optical diffraction techniques can be used to monitor or detect or determine strain in MRAM arrays including a plurality of MTJs. The strain affects the performance of the MRAM array and monitoring or determining the strain state is necessary to obtain optimum performance.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method of device fabrication and a semiconductor device thereby fabricated to monitor/determine strain of MRAM (magnetoresistive random access memory) arrays (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A system for determining strain in a magnetoresistive random access memory (MRAM) structure, the system comprising:
   an array of magnetic tunnel junction (MTJ) devices with a plurality of bit lines; and
   a monochromatic light source directed on a portion of the plurality of bit lines to produce a diffraction pattern;
   wherein the diffraction pattern provided by the plurality of bit lines is used to determine changes in interference fringe spacing correlating to changes in local strain.

2. The system of claim 1, wherein the monochromatic light source is a laser.

3. The system of claim 1, wherein the wherein the bit lines have uniform spacing along the MRAM structure.

4. The system of claim 1, wherein patterns of bit lines are used as a diffraction grid.

5. The system of claim 1, wherein changes from about 10 ppm to about 100 ppm are determined for the interference fringe spacing.

6. The system of claim 1, wherein a performance of the MRAM structure is determined from values of the changes in the local strain.

* * * * *